United States Patent
Chen et al.

(10) Patent No.: US 9,681,549 B2
(45) Date of Patent: Jun. 13, 2017

(54) CONICAL INDUCTOR, PRINTED CIRCUIT BOARD, AND OPTICAL MODULE

(71) Applicant: Huawei Technologies Co., Ltd., Shenzhen, Guangdong (CN)

(72) Inventors: Tewei Chen, Shenzhen (CN); Huili Fu, Shenzhen (CN); Nan Zhao, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/261,389

(22) Filed: Sep. 9, 2016

(65) Prior Publication Data
US 2016/0381803 A1    Dec. 29, 2016

Related U.S. Application Data

(63) Continuation of application No. PCT/CN2014/089686, filed on Oct. 28, 2014.

(30) Foreign Application Priority Data

Mar. 12, 2014    (CN) .......................... 2014 1 0091314

(51) Int. Cl.
*H01F 27/04*    (2006.01)
*H01F 5/00*    (2006.01)
(Continued)

(52) U.S. Cl.
CPC ............. *H05K 1/181* (2013.01); *H01F 5/00* (2013.01); *H01F 19/00* (2013.01); *H01F 27/292* (2013.01);
(Continued)

(58) Field of Classification Search
CPC .... H01F 2005/006; H01F 17/02; H01F 27/06; H01F 27/027; H01F 27/04; H01F 27/26;
(Continued)

(56) References Cited

U.S. PATENT DOCUMENTS 3,641,587 A  * 2/1972 Virsberg .......... G01R 19/16585
                                                                       324/103 P
4,064,356 A    12/1977 Marler, Jr. et al.
(Continued)

FOREIGN PATENT DOCUMENTS

CN        1316750 A       10/2001
CN        1722539 A        1/2006
(Continued)

OTHER PUBLICATIONS

"Bent Leads of LSI Package (All Surface Mount Parts)", IBM Technical Disclosure Bulletin, vol. 36, No. 11, Nov. 1, 1993, p. 215.

*Primary Examiner* — Hoa C Nguyen

(57) ABSTRACT

A conical inductor provided in the present invention includes: a housing, a conical coil located inside the housing, a first pin and a second pin respectively connected to two ends of the conical coil, where one end of the first pin is connected to one end of the conical coil, the other end of the first pin is connected to a hole in a first side wall of the housing in a fastened manner, one end of the second pin is connected to the other end of the conical inductor, and the other end of the second pin is connected to a hole in a second side wall of the housing in a fastened manner; and each of the first pin and the second pin includes one segment of waveform segment fluctuating in a direction perpendicular to a top wall of the housing.

8 Claims, 4 Drawing Sheets

(51) Int. Cl.
*H05K 1/18* (2006.01)
*H05K 3/34* (2006.01)
*H01F 27/29* (2006.01)
*H01F 19/00* (2006.01)

(52) U.S. Cl.
CPC ..... *H05K 3/3426* (2013.01); *H01F 2005/006* (2013.01); *H05K 2201/1003* (2013.01); *H05K 2201/10121* (2013.01); *H05K 2201/10757* (2013.01); *Y02P 70/613* (2015.11)

(58) Field of Classification Search
CPC ...... H01F 27/226; H01F 27/30; H01F 27/306; H01F 6/06; H01F 6/065
USPC ...................... 336/231, 90, 92, 65
See application file for complete search history.

(56) References Cited

U.S. PATENT DOCUMENTS

| | | | |
|---|---|---|---|
| 5,241,134 A | 8/1993 | Yoo | |
| 6,236,289 B1* | 5/2001 | Slenker | H01F 17/04 333/181 |
| 6,344,781 B1* | 2/2002 | Slenker | H01F 17/04 174/551 |
| 6,889,434 B2* | 5/2005 | Hernandez | H01F 41/10 29/592.1 |
| 2001/0033175 A1 | 10/2001 | Marbach et al. | |
| 2005/0093670 A1* | 5/2005 | Neumann | H01F 17/04 336/208 |
| 2005/0230148 A1 | 10/2005 | Sinnett et al. | |
| 2006/0139124 A1* | 6/2006 | Fojas | H01P 5/02 333/185 |
| 2007/0094863 A1* | 5/2007 | Ogawa | H01F 17/045 29/605 |
| 2007/0164843 A1* | 7/2007 | Yagisawa | H01F 5/00 336/83 |
| 2008/0042785 A1* | 2/2008 | Yagisawa | H01P 1/2007 333/245 |
| 2010/0301983 A1 | 12/2010 | Furuta et al. | |
| 2011/0193887 A1 | 8/2011 | Lee et al. | |
| 2012/0188043 A1* | 7/2012 | Saito | H01F 5/00 336/105 |

FOREIGN PATENT DOCUMENTS

| | | |
|---|---|---|
| CN | 101901667 A | 12/2010 |
| CN | 201845638 U | 5/2011 |
| CN | 102157259 A | 8/2011 |
| CN | 203386761 U | 1/2014 |
| CN | 203397881 U | 1/2014 |
| CN | 103839661 A | 6/2014 |
| DE | 3615308 A1 | 12/1987 |
| JP | 2002097936 A | 4/2002 |
| JP | 2002168825 A | 6/2002 |

* cited by examiner

<Prior Art>

<Prior Art>

<Prior Art>

CONICAL INDUCTOR, PRINTED CIRCUIT BOARD, AND OPTICAL MODULE

CROSS-REFERENCE TO RELATED APPLICATIONS

This application is a continuation of International Application No. PCT/CN2014/089686, filed on Oct. 28, 2014, which claims priority to Chinese Patent Application No. 201410091314.7, filed on Mar. 12, 2014, The disclosures of the aforementioned applications are hereby incorporated by reference in their entireties.

TECHNICAL FIELD

The present invention relates to the field of communications technologies, and in particular, to a conical inductor, a printed circuit board, and an optical module.

BACKGROUND

Due to high bandwidth and a large inductance quality factor (Q value), a conical inductor is widely applied to an encapsulated interior of a 100G optical module such as a CFP/CFP2 in a transport network. For example, FIG. 1 is a schematic diagram of a basic structure of a conical inductor. As shown in FIG. 1, the conical inductor is formed by winding conducting wires and has a shape similar to a cone. When the conical inductor is applied to an encapsulated interior of an optical module, each of two ends of the conical inductor is connected to a pin and is soldered to a printed circuit board (PCB for short) by using the pin. To reduce parasitics of the pin, in a process of soldering the conical inductor to the printed circuit board, a surface mount technology (SMT for short) is used. However, because the structure of the conical inductor shown in FIG. 1 is irregular, in an assembling process by means of soldering by using the SMT, a suction nozzle of an SMT device cannot hold the conical inductor, which causes a failure to directly use the conical inductor shown in FIG. 1 in a soldering process by using the SMT. Therefore, in actual use, the conical inductor is fastened inside a housing of a regular shape, so that the suction nozzle of the SMT device sucks the housing to solder the conical inductor to the printed circuit board. For example, FIG. 2 is a schematic structural diagram of a conical inductor actually used in the industry. As shown in FIG. 2, the conical inductor includes a housing, a conical coil, and pins that are of the conical inductor and are respectively connected to two ends of the conical coil, where a hole is separately disposed on two sides of the housing, and the pins of the conical inductor are of a straight cylinder shape and are respectively fastened to to the holes in the housing, so as to fasten the conical inductor inside the housing.

However, the conical inductor actually used in the industry currently causes the following two problems:

(1) Generally, a pin of the conical inductor actually used in the industry is relatively thin. For example, FIG. 3 is a top view of soldering a conical inductor actually used in the industry to a printed circuit board. As shown in FIG. 3, a pin of the conical inductor is relatively thin in comparison with a pad on the printed circuit board; therefore, in a case in which a width of the pad on the printed circuit board is fixed, the pin of the conical inductor is prone to deviate from the pad on the printed circuit board, and alignment is relatively poor.

(2) A particular spacing exists between the pin of the conical inductor and a surface of the printed circuit board. For example, FIG. 4 is a side view and an enlarged view of soldering a conical inductor actually used in the industry to a printed circuit board. As shown in FIG. 4, a height between a pin of the conical inductor and a surface of the printed circuit board is S; therefore, in a process of soldering the conical inductor to the printed circuit board by using the SMT, it is likely that the pin of the conical inductor cannot come in contact with a pad on the printed circuit board and soldering tin of the pad, which is prone to cause pseudo soldering of the conical inductor.

SUMMARY

Embodiments of the present invention provide a conical inductor, a printed circuit board, and an optical module. By changing a pin of the conical inductor, accuracy of alignment between the pin of the conical inductor and a pad of the printed circuit board is improved, and pseudo soldering of the conical inductor is also reduced.

Technical solutions used in the embodiments of the present invention are as follows:

According to a first aspect, an embodiment of the present invention provides a conical inductor, including a housing, a conical coil, a first pin, and a second pin, where:

the housing includes a top wall, and a first side wall and a second side wall that are connected to the top wall, and a hole is separately disposed on a side, away from the top wall, of each of the first side wall and the second side wall;

the conical coil is located in a cavity formed by the top wall, the first side wall, and the second side wall that are of the housing;

one end of the first pin is connected to one end of the conical coil, the other end of the first pin is connected to the hole in the first side wall in a fastened manner, one end of the second pin is connected to the other end of the conical inductor, and the other end of the second pin is connected to the hole in the second side wall in a fastened manner; and each of the first pin and the second pin includes one waveform segment fluctuating in a direction perpendicular to the top wall, where each trough of the waveform segment is connected to a printed circuit board in a fastened manner.

With reference to the first aspect, in a first possible implementation manner of the first aspect, the waveform segment is a square wave segment, where the waveform segment includes at least two troughs.

With reference to the first aspect or the first possible implementation manner of the first aspect, in a second possible implementation manner of the first aspect, a height between a trough of a waveform segment of the first pin and the side, away from the top wall, of the first side wall is greater than a height between the hole in the first side wall and the side, away from the top wall, of the first side wall;

a height between a trough of a waveform segment of the second pin and the side, away from the top wall, of the second side wall is greater than a height between the hole in the second side wall and the side, away from the top wall, of the second side wall; and troughs of the waveform segment of the first pin and troughs of the waveform segment of the second pin are located on a same plane.

With reference to any one of the first aspect to the second possible implementation manner of the first aspect, in a third possible implementation manner of the first aspect, a width of the waveform segment is greater than a diameter of a conducting wire of the conical coil.

With reference to any one of the first aspect to the third possible implementation manner of the first aspect, in a fourth possible implementation manner of the first aspect, the first pin is led out from one end of the conical inductor; and the second pin is led out from the other end of the conical inductor.

According to a second aspect, an embodiment of the present invention provides a printed circuit board, including the conical inductor according to any implementation manner of the first aspect to the fourth possible implementation manner of the first aspect.

With reference to the second aspect, in a first possible implementation manner of the second aspect, troughs of each pin of the conical inductor are connected to the printed circuit board in a fastened manner by using soldering tin on a pad of the printed circuit board.

According to a third aspect, an embodiment of the present invention provides an optical module, including the printed circuit board according to the second aspect or the first possible implementation manner of the second aspect.

It may be learned from the foregoing that the embodiments of the present invention provide a conical inductor, including a housing, a conical coil, a first pin, and a second pin, where the housing includes a top wall, and a first side wall and a second side wall that are connected to the top wall. A hole is separately disposed on a side, away from the top wall, of each of the first side wall and the second side wall; the conical coil is located in a cavity formed by the top wall, the first side wall, and the second side wall that are of the housing. One end of the first pin is connected to one end of the conical coil, the other end of the first pin is connected to the hole in the first side wall in a fastened manner, one end of the second pin is connected to the other end of the conical inductor, and the other end of the second pin is connected to the hole in the second side wall in a fastened manner. Each of the first pin and the second pin includes one waveform segment fluctuating in a direction perpendicular to the top wall, where each trough of the waveform segment is connected to a printed circuit board in a fastened manner. Therefore, by changing a pin of the conical inductor, accuracy of alignment between the pin of the conical inductor and a pad of the printed circuit board is improved, and pseudo soldering of the conical inductor is also reduced, which avoids problems of relatively poor alignment between the pin of the conical inductor and the pad on the printed circuit board, and pseudo soldering of the conical inductor in the prior art.

BRIEF DESCRIPTION OF THE DRAWINGS

To describe the technical solutions in the embodiments of the present invention or in the prior art more clearly, the following briefly introduces the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DETAILED DESCRIPTION

The following clearly describes the technical solutions in the embodiments of the present invention with reference to the accompanying drawings in the embodiments of the present invention. Apparently, the described embodiments are merely some but not all of the embodiments of the present invention. All other embodiments obtained by a person of ordinary skill in the art based on the embodiments of the present invention without creative efforts shall fall within the protection scope of the present invention.

Embodiment 1

Figure 1:
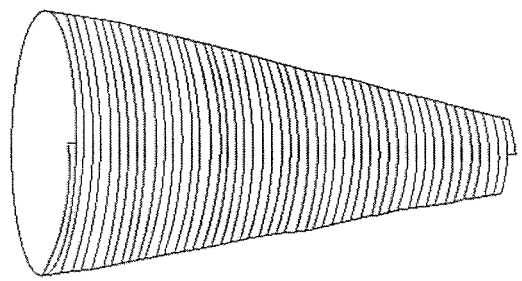
FIG. 1 is a basic schematic structural diagram of a conical inductor.
Figure 2:
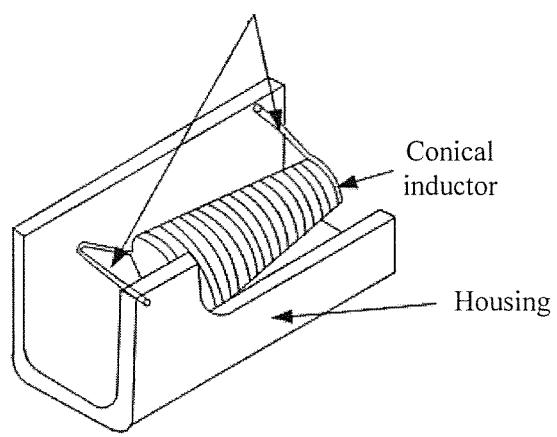
FIG. 2 is a schematic structural diagram of a conical inductor actually used in the industry.
Figure 3:
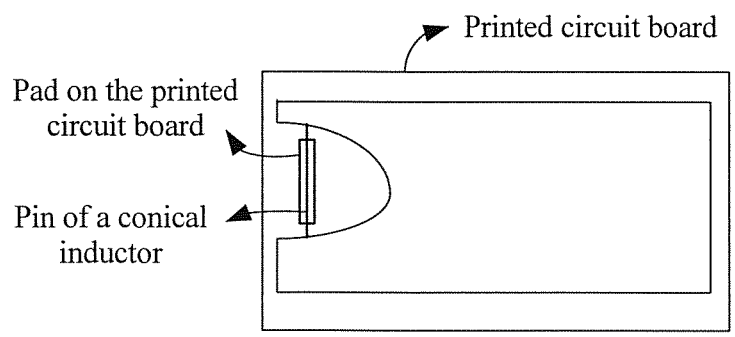
FIG. 3 is a top view of soldering a conical inductor actually used in the industry to a printed circuit board.
Figure 4:
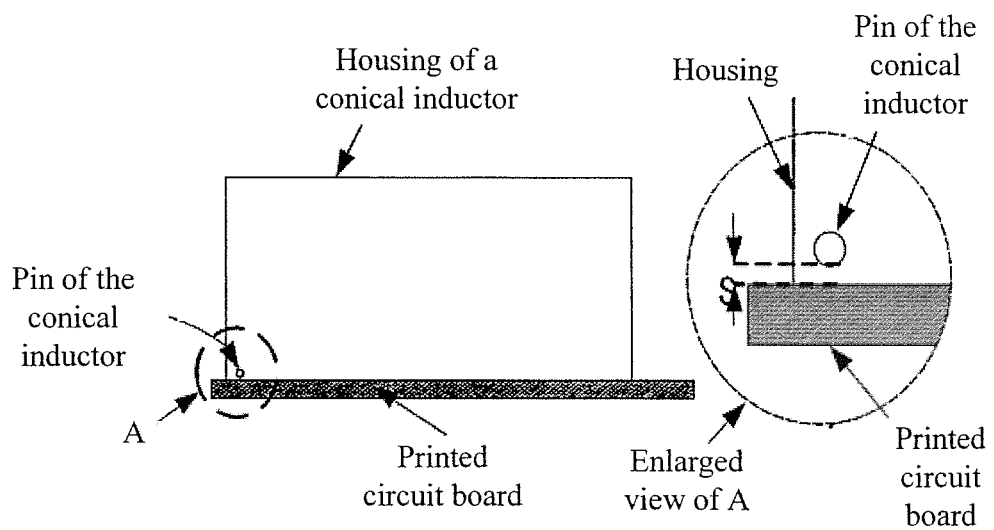
FIG. 4 is a side view of soldering a conical inductor actually used in the industry to a printed circuit board and an enlarged view of A.
Figure 5:
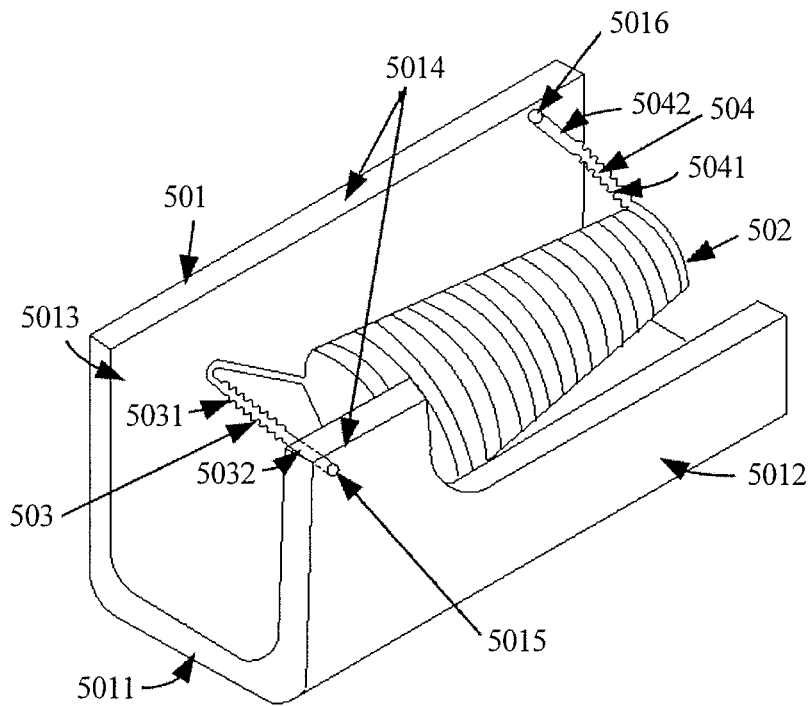
FIG. 5 is a schematic diagram of composition of a conical inductor 50 according to an embodiment of the present invention.

FIG. 5 is a schematic diagram of composition of a conical inductor 50 according to an embodiment of the present invention. As shown in FIG. 5, the conical inductor 50 includes a housing 501, a conical coil 502, a first pin 503, and a second pin 504, where:

the housing 501 includes a top wall 5011, and a first side wall 5012 and a second side wall 5013 that are connected to the top wall 5011, and a hole 5015 and a hole 5016 are respectively disposed on two sides 5014 that are respectively of the first side wall 5012 and the second side wall 5013 and that are distant from the top wall 5011; and the first ends 5014 are two ends that are respectively of the first side wall 5012 and the second side wall 5013 and that are distant from the top wall 5011. It should be noted that a gap part of the first side wall 5012 shown in FIG. 5 is provided for convenience of description of components of the conical inductor and imposes no limitation on the conical inductor provided in this embodiment of the present invention.

Preferably, the top wall 5011 may be a rectangular plane, and a size of the top wall 5011 is set according to a requirement, which is not limited in this embodiment of the present invention; in addition, the top wall 5011 is perpendicularly connected to both the first side wall 5012 and the second side wall 5013.

The conical coil 502 is formed by winding conducting wires, has a cone shape, and is located in a cavity formed by the top wall 5011, the first side wall 5012, and the second side wall 5013 that are of the housing 501; one end of the conical coil 502 is connected to the first pin 503, and the other end of the conical inductor 502 is connected to the second pin 504.

Preferably, the conical coil may be formed by winding cylindrical conducting wires.

Each of the first pin 503 and the second pin 504 includes one waveform segment fluctuating in a direction perpendicular to the top wall 5011, where each trough of the waveform segment is connected to a printed circuit board in a fastened manner.

Preferably, as shown in FIG. 5, the first pin 503 includes a waveform segment 5031 and a straight-line segment 5032, and the second pin 504 includes a waveform segment 5041 and a straight-line segment 5042, where the waveform segment 5031 of the first pin 503 is connected to one end of the conical coil 502, the straight-line segment 5032 of the first pin 503 is connected to the hole 5015 in the first side wall 5012 in a fastened manner, the waveform segment 5041 of the second pin 504 is connected to the other end of the conical coil 502, and the straight-line segment 5042 of the second pin 504 is connected to the hole 5016 in the second side wall 5013 in a fastened manner.

Figure 6A:
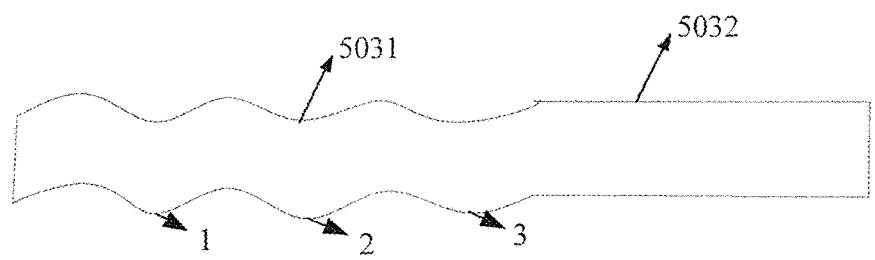
FIG. 6A is an enlarged view of a first pin according to an embodiment of the present invention.
Figure 6B:
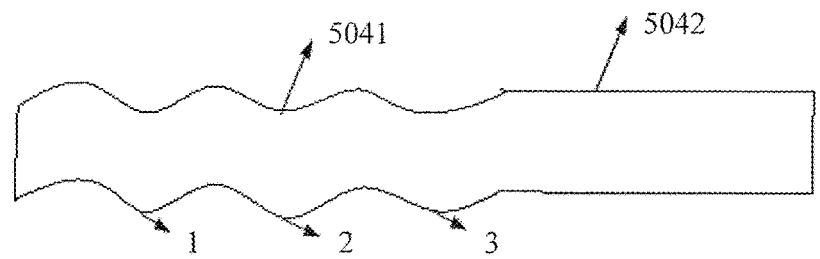
FIG. 6B is an enlarged view of a second pin according to an embodiment of the present invention.

Each of the waveform segment 5031 of the first pin 503 and the waveform segment 5041 of the second pin 504 is one waveform segment fluctuating in a direction perpendicular to the top wall 5011, and includes at least two troughs, and both the straight-line segment 5032 of the first pin 503 and the straight-line segment 5042 of the second pin 504 are of a straight cylinder shape same as that of the conducting wire of the conical inductor, which implements processing of a part of a straight cylindrical pin of a conical inductor actually used in the industry currently. For example, FIG. 6A is an enlarged view of the first pin according to this embodiment of the present invention; FIG. 6B is an enlarged view of the second pin according to this embodiment of the present invention. As shown in FIG. 6A, the waveform segment 5031 of the first pin includes three troughs 1, 2, and 3, and as shown in FIG. 6B, the waveform segment 5041 of the second pin includes three troughs 1, 2, and 3. It should be noted that a quantity of troughs that are included in the waveform segment 5031 of the first pin and the waveform segment 5041 of the second pin is set according to a requirement, which is not limited in this embodiment of the present invention.

A width of the waveform segment included in the first pin 503 and a width of the waveform segment included in the second pin 504 are each greater than a diameter of the conducting wire of the conical coil. Preferably, in FIG. 5, the width of the waveform segment 5031 of the first pin 503 is greater than a diameter of the straight-line segment 5032 of the first pin 503, and the width of the waveform segment 5041 of the second pin 504 is greater than a diameter of the straight-line segment 5042 of the second pin 504. A pin is widened, so that a pin of the conical inductor becomes thicker in comparison with a pad on the printed circuit board, and alignment accuracy of soldering the conical inductor to the printed circuit board is improved. Only the first pin is used as an example for description in the following.

Figure 7:
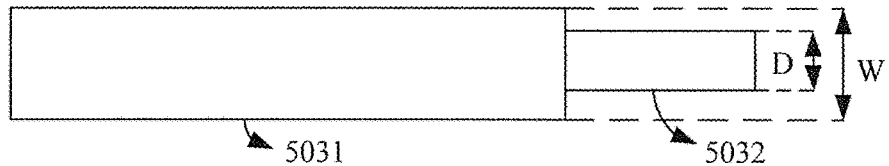
FIG. 7 is a schematic diagram of a size of a first pin according to an embodiment of the present invention.

FIG. 7 is a schematic diagram of a size of the first pin according to the present invention. As shown in FIG. 7, the width of the waveform segment 5031 of the first pin is W, the diameter of the straight-line segment 5032 of the first pin is D, and it may be seen from FIG. 7 that W is greater than D. It should be noted that the width of the waveform segment 5031 and the width of the waveform segment 5041 may be set according to an actual usage situation, which is not limited in this embodiment of the present invention.

Preferably, a height between a trough of the waveform segment 5031 of the first pin 503 and the hole 5015 in the first side wall 5012 is greater than a height between the hole 5015 in the first side wall 5012 and the side 5014 that is of the first side wall 5012 and that is distant from the top wall 5011; a height between a trough of the waveform segment 5041 of the second pin 504 and the hole 5016 in the second side wall 5013 is greater than a height between the hole 5016 in the second side wall 5013 and the side 5014 that is of the second side wall 5013 and that is distant from the top wall 5011; troughs of the waveform segment 5031 of the first pin 503 and troughs of the waveform segment 5041 of the second pin 504 are located on a same plane. Therefore, in a process of soldering the conical inductor to the printed circuit board, a trough of a pin easily comes in contact with a surface of the printed circuit board, and no pseudo soldering is formed. It should be noted that the height between the trough of the waveform segment 5031 of the first pin and the hole 5015 in the first side wall 5012 and the height between the trough of the waveform segment 5041 of the second pin 504 and the hole 5016 in the second side wall 5013 are set according to an actual situation in engineering, which is not limited in this embodiment of the present invention. Only the first pin is used as an example for description in the following.

Figure 8:
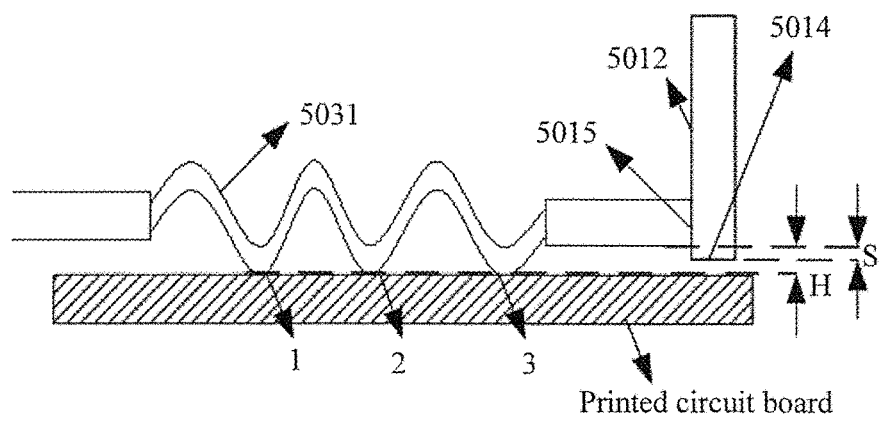
FIG. 8 is a side view of soldering a first pin to a printed circuit board according to an embodiment of the present invention.

FIG. 8 is a side view of soldering the first pin to the printed circuit board according to this embodiment of the present invention. As shown in FIG. 8, the waveform segment 5031 of the first pin includes three troughs 1, 2, and 3. The height between the trough and the hole 5015 in the first side wall is H, and the height between the hole 5015 in the first side wall and the side 5014 that is of the first side wall 5012 of the housing and that is distant from the top wall 5011 is S. It may be seen from FIG. 8 that H is greater than S, and the troughs of the waveform segment 5031 of the first pin 503 are in contact with the printed circuit board.

Figure 9:
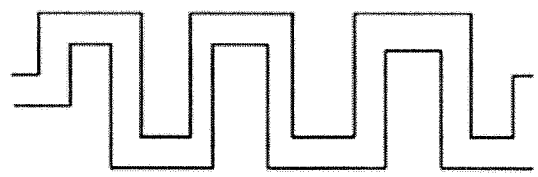
FIG. 9 is a schematic diagram of a shape of a pin of a conical inductor according to an embodiment of the present invention.

Further, a waveform of the waveform segment 5031 of the first pin and a waveform of the waveform segment 5041 of the second pin may be square wave segments shown in FIG. 9, and include at least two troughs. It should be noted that the waveform of the waveform segment 5031 and the waveform of the waveform segment 5041 may be waveforms of another shape, such as oblique waves. Specific shapes of the waveform of the waveform segment 5031 and the waveform of the waveform segment 5041 may be set according to an engineering requirement, which is not limited in this embodiment of the present invention.

In this embodiment of the present invention, preferably, the first pin 503 is led out from one end of the conical inductor, and the second pin 504 is led out from the other end of the conical inductor, so that a pin of the conical coil and the conical coil are formed integrally. It is easy to produce conical inductors in batches in practical application.

It may be learned from the foregoing that this embodiment of the present invention provides a conical inductor, including a housing, a conical coil, a first pin, and a second pin, where the housing includes a top wall, and a first side wall and a second side wall that are connected to the top wall. A hole is separately disposed at a location close to a first end of each of the first side wall and the second side wall, where the first end is an end away from the top wall. The conical coil is located in a cavity formed by the top wall, the first side wall, and the second side wall that are of the housing. Each of the first pin and the second pin includes a waveform segment and a straight-line segment, where the waveform segment of the first pin is connected to one end of the conical coil, the straight-line segment of the first pin is connected to the hole in the first side wall in a fastened manner, the waveform segment of the second pin is connected to the other end of the conical coil, and the straight-line segment of the second pin is connected to the hole in the second side wall in a fastened manner. The waveform segment of the first pin and the waveform segment of the second pin each are in a wave shape and include at least two troughs, where a height between a trough of the waveform segment of the first pin and the straight-line segment of the first pin is greater than a height between the straight-line segment of the first pin and the first end of the first side wall, and a height between a trough of the waveform segment of the second pin and the straight-line segment of the second pin is greater than a height between the straight-line segment of the second pin and the first end of the second side wall. Troughs of the waveform segment of the first pin and troughs of the waveform segment of the second pin are located on a same plane; a width of the waveform segment of the first pin is greater than a diameter of the straight-line segment of the first pin, and a width of the waveform segment of the second pin is greater than a diameter of the straight-line segment of the second pin. In this way, by changing a pin of the conical inductor, accuracy of alignment between the pin of the conical inductor and a pad of a printed circuit board is improved, and pseudo soldering of the conical inductor is alleviated, which avoids problems of relatively poor alignment between the pin of the conical inductor and the pad on the printed circuit board, and pseudo soldering of the conical inductor in the prior art.

Embodiment 2

Figure 10:
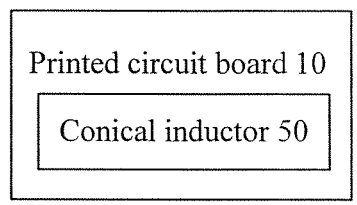
FIG. 10 is a structural diagram of a printed circuit board according to an embodiment of the present invention.

FIG. 10 is a structural diagram of a printed circuit board 10 according to an embodiment of the present invention. As shown in FIG. 10, the printed circuit board 10 includes a conical inductor 50.

The conical inductor 50 is the same as the conical inductor described in Embodiment 1, and details are not described herein again.

Troughs of each pin of the conical inductor 50 are connected to the printed circuit board in a fastened manner by using soldering tin on a pad of the printed circuit board 10.

Preferably, the conical inductor 50 may be soldered to the printed circuit board 10 by using a surface mount technology (SMT for short).

It may be learned from the foregoing that, this embodiment of the present invention provides a printed circuit board 10, including a conical inductor 50, where the housing includes a top wall, and a first side wall and a second side wall that are connected to the top wall. A hole is separately disposed on a side, away from the top wall, of each of the first side wall and the second side wall; the conical coil is located in a cavity formed by the top wall, the first side wall, and the second side wall that are of the housing. One end of the first pin is connected to one end of the conical coil, the other end of the first pin is connected to the hole in the first side wall in a fastened manner, one end of the second pin is connected to the other end of the conical coil, and the other end of the second pin is connected to the hole in the second side wall in a fastened manner. Each of the first pin and the second pin includes one waveform segment fluctuating in a direction perpendicular to the top wall, where each trough of the waveform segment is connected to the printed circuit board in a fastened manner. In this way, by changing a pin of the conical inductor, accuracy of alignment between the pin of the conical inductor and a pad of the printed circuit board is improved, and pseudo soldering of the conical inductor is alleviated, which avoids problems of relatively poor alignment between the pin of the conical inductor and the pad on the printed circuit board, and pseudo soldering of the conical inductor in the prior art.

Embodiment 3

Figure 11:
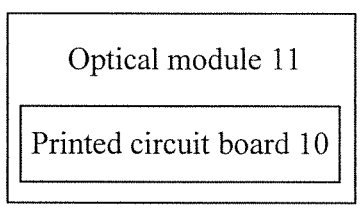
FIG. 11 is a structural diagram of an optical module according to an embodiment of the present invention.

FIG. 11 is a structural diagram of an optical module 11 according to an embodiment of the present invention. As shown in FIG. 11, the optical module 11 includes a printed circuit board 10.

The printed circuit board 10 is the same as the printed circuit board in Embodiment 2, and details are not described herein again.

It may be learned from the foregoing that, this embodiment of the present invention provides an optical module 11, including a printed circuit board 10, and the printed circuit board includes a conical coil, where the housing includes a top wall, and a first side wall and a second side wall that are connected to the top wall. A hole is separately disposed on a side, away from the top wall, of each of the first side wall and the second side wall; the conical coil is located in a cavity formed by the top wall, the first side wall, and the second side wall that are of the housing. One end of the first pin is connected to one end of the conical coil, the other end of the first pin is connected to the hole in the first side wall in a fastened manner, one end of the second pin is connected to the other end of the conical inductor, and the other end of the second pin is connected to the hole in the second side wall in a fastened manner. Each of the first pin and the second pin includes one waveform segment fluctuating in a direction perpendicular to the top wall, where each trough of the waveform segment is connected to the printed circuit board in a fastened manner. In this way, by changing a pin of the conical inductor, accuracy of alignment between the pin of the conical inductor and a pad of the printed circuit board is improved, and pseudo soldering of the conical inductor is alleviated, which avoids problems of relatively poor alignment between the pin of the conical inductor and the pad on the printed circuit board, and pseudo soldering of the conical inductor in the prior art.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:
1. A conical inductor, comprising:
a housing;
a conical coil;
a first pin; and
a second pin;
wherein the housing comprises:
   a top wall, and a first side wall and a second side wall that are connected to the top wall, and a hole that is separately disposed on a side, away from the top wall, of each of the first side wall and the second side wall;

wherein the conical coil is located in a cavity formed by the top wall, the first side wall, and the second side wall of the housing;

wherein one end of the first pin is connected to one end of the conical coil, the other end of the first pin is connected to the hole in the first side wall in a fastened manner, one end of the second pin is connected to the other end of the conical coil, and the other end of the second pin is connected to the hole in the second side wall in a fastened manner; and wherein each of the first pin and the second pin comprises one waveform segment fluctuating in a direction perpendicular to the top wall, wherein each trough of the waveform segment is connected to a printed circuit board in a fastened manner.

2. The conical inductor according to claim 1, wherein:
the waveform segment is a square wave segment, wherein the waveform segment comprises at least two troughs.

3. The conical inductor according to claim 1, wherein:
a height between a trough of a waveform segment of the first pin and the hole in the first side wall is greater than a height between the hole in the first side wall and the side, away from the top wall, of the first side wall;

a height between a trough of a waveform segment of the second pin and the hole in the second side wall is greater than a height between the hole in the second side wall and the side, away from the top wall, of the second side wall; and a trough of the waveform segment of the first pin and a trough of the waveform segment of the second pin are located on a same plane.

4. The conical inductor according to claim 1, wherein:
a width of the waveform segment is greater than a diameter of a conducting wire of the conical coil.

5. The conical inductor according to claim 1, wherein:
the first pin is led out from one end of the conical inductor; and
the second pin is led out from the other end of the conical inductor.

6. A printed circuit board, comprising:
a conical inductor, the conical inductor comprising:
 a housing,
 a conical coil
 a first pin, and
 a second pin;
wherein the housing comprises:
 a top wall, and a first side wall and a second side wall that are connected to the top wall, and a hole that is separately disposed on a side, away from the top wall, of each of the first side wall and the second side wall;

wherein the conical coil is located in a cavity formed by the top wall, the first side wall, and the second side wall of the housing;

wherein one end of the first pin is connected to one end of the conical coil, the other end of the first pin is connected to the hole in the first side wall in a fastened manner, one end of the second pin is connected to the other end of the conical coil, and the other end of the second pin is connected to the hole in the second side wall in a fastened manner; and wherein each of the first pin and the second pin comprises one waveform segment fluctuating in a direction perpendicular to the top wall, wherein each trough of the waveform segment is connected to a printed circuit board in a fastened manner.

7. The printed circuit board according to claim 6, wherein:
troughs of each pin of the conical inductor are connected to the printed circuit board in a fastened manner through a pad of the printed circuit board.

8. An optical module, comprising:
a printed circuit board, the printed circuit board comprising:
 a conical inductor, the conical inductor comprising:
  a housing,
  a conical coil,
  a first pin, and
  a second pin;
 wherein the housing comprises:
  a top wall, and a first side wall and a second side wall that are connected to the top wall, and a hole that is separately disposed on a side, away from the top wall, of each of the first side wall and the second side wall;
 wherein the conical coil is located in a cavity formed by the top wall, the first side wall, and the second side wall of the housing;
 wherein one end of the first pin is connected to one end of the conical coil, the other end of the first pin is connected to the hole in the first side wall in a fastened manner, one end of the second pin is connected to the other end of the conical coil, and the other end of the second pin is connected to the hole in the second side wall in a fastened manner; and
 wherein each of the first pin and the second pin comprises one waveform segment fluctuating in a direction perpendicular to the top wall, wherein each trough of the waveform segment is connected to a printed circuit board in a fastened manner.

* * * * *